(12) United States Patent
Cho

(10) Patent No.: US 7,397,412 B1
(45) Date of Patent: Jul. 8, 2008

(54) LOW POWER ANALOG TO DIGITAL CONVERTER

(75) Inventor: Thomas B. Cho, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/486,906

(22) Filed: Jul. 14, 2006

Related U.S. Application Data

(60) Provisional application No. 60/764,985, filed on Feb. 3, 2006.

(51) Int. Cl.
*H03M 1/38* (2006.01)

(52) U.S. Cl. .................................. 341/161; 341/155

(58) Field of Classification Search ................. 341/155, 341/161, 162, 172, 122
See application file for complete search history.

(56) References Cited

U.S. PATENT DOCUMENTS

| | | | | |
|---|---|---|---|---|
| 5,764,176 A * | 6/1998 | Ginetti | ................... | 341/161 |
| 5,874,912 A * | 2/1999 | Hasegawa | ................... | 341/161 |
| 6,249,240 B1 * | 6/2001 | Bellaouar | ................... | 341/172 |
| 6,295,016 B1 * | 9/2001 | Chiang | ................... | 341/161 |
| 6,337,651 B1 * | 1/2002 | Chiang | ................... | 341/161 |
| 6,369,744 B1 * | 4/2002 | Chuang | ................... | 341/161 |
| 6,744,395 B1 * | 6/2004 | Perelman et al. | ................... | 341/161 |
| 6,839,015 B1 * | 1/2005 | Sutardja et al. | ................... | 341/161 |
| 6,839,016 B2 * | 1/2005 | Roza | ................... | 341/161 |
| 6,859,158 B2 * | 2/2005 | Wada et al. | ................... | 341/155 |
| 6,954,169 B1 * | 10/2005 | Min | ................... | 341/172 |
| 7,023,373 B2 * | 4/2006 | da Fonte Dias | ................... | 341/162 |
| 7,088,278 B2 * | 8/2006 | Kurose et al. | ................... | 341/155 |
| 7,148,833 B1 * | 12/2006 | Cho et al. | ................... | 341/162 |
| 2005/0219101 A1 * | 10/2005 | Kurose et al. | ................... | 341/155 |
| 2006/0187107 A1 * | 8/2006 | Kurose et al. | ................... | 341/155 |
| 2007/0090987 A1 * | 4/2007 | Cho et al. | ................... | 341/161 |

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

(Continued)

*Primary Examiner*—Linh Nguyen

(57) ABSTRACT

A pipelined analog to digital converter comprises N stages, wherein N is an integer greater than one. A sample and integrate circuit communicates with at least two stages of the N stages. The sample and integrate circuit selectively samples a first voltage input to one of the at least two stages while integrating a difference between a sampled second voltage input of another one of the at least two stages and a second reference voltage to generate a second residue. The sample and integrate circuit selectively integrates a difference between the sampled first voltage and a first reference voltage to generate a first residue while sampling a second voltage input.

54 Claims, 11 Drawing Sheets

OTHER PUBLICATIONS

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.11b-1999/Cor 1-2001 (Corrigendum to IEEE Std 802.11-1999); IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 2: Higher-Speed Physical Layer (PHY) extension in the 2.4 GHz Band—Corrigendum 1; LAN/MAN Standards Committee of the IEEE Computer Society; Nov. 7, 2001; 23 pages.

IEEE Std 802.11g/D2.8, May 2002 (Supplement to ANSI/IEEE Std 802.11, 1999 Edition) DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.

IEEE P802.11g/D8.2, Apr. 2003 (Supplement to ANSI/IEEE Std 802.11-1999(Reaff 2003)); DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

802.11n; IEEE P802.11-04/0889r6; Wireless LANs, TGn Sync Proposal Technical Specification; 131 pages, no date.

IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE 802.20-PD-06, IEEE P 802.20 V14, Jul. 16, 2004, Draft 802.20 Permanent Document, System Requirements for IEEE 802.20 Mobile Broadband Wireless Access Systems—Version 14, 23 pages.

Specification of the Bluetooth System Master Table of Contents & Compliance Requirements; Covered Core Package version: 2.0 + EDR Current Master TOC issued: Nov. 4, 2004; pp. 1-72; pp. 1-92; pp. 1-812, pp. 1-250.

IEEE Std 802.11h - 2003 (Amendment to IEEE Std 802.11, 1999 Edition (Reaff 2003)); as amended by IEEE Stds 802.11a-1999, 802.11b-1999, 802.11b-1999/Cor 1-2001, 802.11d-2001, and 802.11g-2003; IEEE Standard for Information technology - Telecommunications and information exchange between systems - Local and metropolitan area networks - Specific requirements - Part 11: Wireless LAN Medium Access Control (MAC) and Physical Layer (PHY) specifications Amendment 5: Spectrum and Transmit Power Management Extensions in the 5 GHz band in Europe; IEEE Computer Society LAN/MAN Standards Committee; Oct. 14, 2003; 74 pages.

Tarighat, Alireza et al; Compensation Schemes and Performance Analysis of IQ Imbalances in OFDM Receivers; IEEE Transactions on Signal Processing, vol. 53, No. 8, Aug. 2005; pp. 3257-3268.

* cited by examiner

US 7,397,412 B1

LOW POWER ANALOG TO DIGITAL CONVERTER

CROSS-REFERENCE TO RELATED APPLICATIONS

This application claims the benefit of U.S. Provisional Application No. 60/764,985, filed on Feb. 3, 2006. The disclosure of the above application is incorporated herein by reference in its entirety.

FIELD

The present disclosure relates to analog to digital converters.

BACKGROUND

Reducing power consumption of electronic devices has become increasingly important, particularly for battery powered devices such as laptop computers, personal digital assistants, cellular phones, MP3 players and other devices. Analog-to-digital converters (ADCs) are commonly used in these electronic devices to transform analog signals to digital signals. Relative to other components, ADCs tend to consume a significant amount of power. Therefore, reducing the power consumption of the ADCs is important for reducing the overall power consumption of the system. The ADC may include a pipelined ADC that utilizes multiple stages. Each stage employs a sample and hold circuit that samples an analog input voltage $V_{in}$ to the pipelined ADC or a residue voltage $V_{res}$ from a prior stage.

Referring now to FIG. 1, a typical pipelined ADC 10 is shown. The ADC 10 includes a plurality of stages 12-1, 12-2, and 12-3 (collectively stages 12) that are cascaded in series. Although three stages 12-1, 12-2, and 12-3 are shown, the pipelined ADC 10 may include additional or fewer stages. Some of the ADC stages 12 include a sample and integrate (or hold) module 14 that samples and integrates (or holds) the analog input signal $V_{in}$ or the residue signal $V_{res}$ from a prior stage.

A low resolution A/D subconverter module 16 quantizes the held analog signal to a resolution of $B_i$ bits where i corresponds to the current stage of the pipelined A/D converter 10. The number of bits per stage $B_i$ and/or the number of stages may be determined in part by the desired sampling rate and resolution. The output of the A/D subconverter module 16 is supplied to a low-resolution D/A subconverter module 18 that converts the resulting digital output signal back into an analog representation.

The D/A subconverter module 18 may have a resolution that is equivalent to that of the corresponding A/D subconverter module 16 of the same stage. A difference module 20 subtracts the analog output from the D/A subconverter module 18 from the voltage input $V_{in}$ to generate a residue signal $V_{res}$. The residue signal $V_{res}$ is equal to the difference between the held analog signal ($V_{in}$ or $V_{res}$ from the prior stage) and the reconstructed analog signal.

An amplifier 22 may be used to amplify the residue signal. The amplified residue signal is output to the next stage 12-2 of the pipelined ADC 10. The first ADC stage 12-1 of the pipelined ADC 10 operates on a most current analog input sample while the second ADC stage 12-2 operates on the amplified residue of the prior input sample. The third stage 12-3 operates on the amplified residue output by the second ADC stage 12-2.

The concurrency of operations allows a conversion speed that is determined by the time it takes in one stage. Once a current stage has completed operating on the analog input sample received from the prior stage, the current stage is available to operate on the next sample.

SUMMARY

A pipelined analog to digital converter comprises N stages, wherein N is an integer greater than one. A sample and integrate circuit communicates with at least two stages of the N stages and includes a first amplifier that integrates one of the N stages while the sample and integrate circuit samples for another one of the N stages and that integrates for the another one of the N stages while the sample and integrate circuit samples for the one of the N stages.

A pipelined analog to digital converter comprises N stages, wherein N is an integer greater than one. A sample and integrate circuit communicates with at least two stages of the N stages. The sample and integrate circuit selectively samples a first voltage input to one of the at least two stages while integrating a difference between a sampled second voltage input of another one of the at least two stages and a second reference voltage to generate a second residue. The sample and integrate circuit selectively integrates a difference between the sampled first voltage and a first reference voltage to generate a first residue while sampling a second voltage input.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
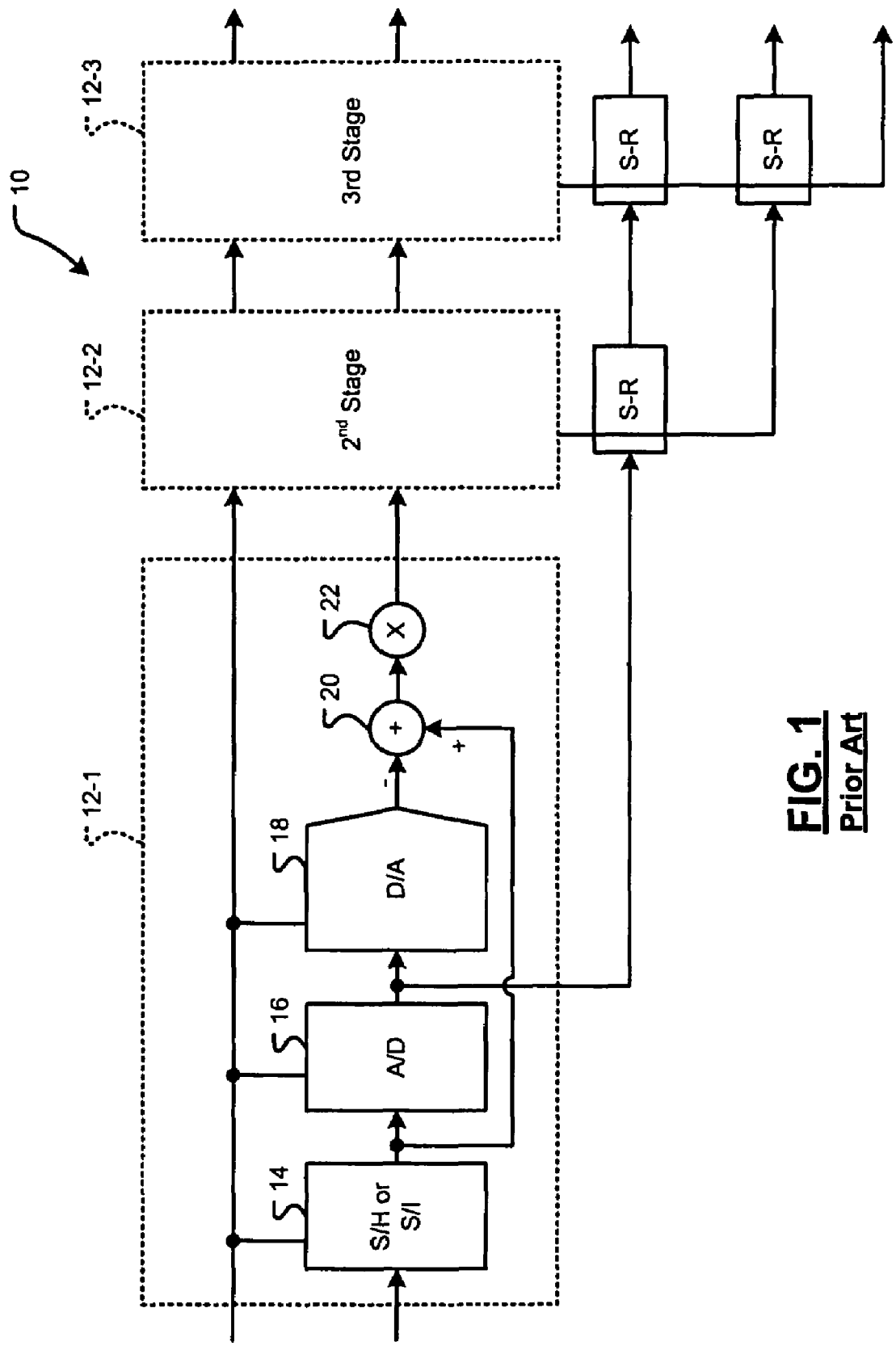
FIG. 1 is a functional block diagram of a pipelined analog to digital converter according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

A pipelined analog to digital converter according to the present disclosure includes N stages. Each stage includes an operational amplifier that consumes current and that is used to implement sample and integrate functions. The operational amplifier consumes a significant amount of current. The operational amplifier is shared between even and odd stages to reduce overall power consumption.

Figure 2A:
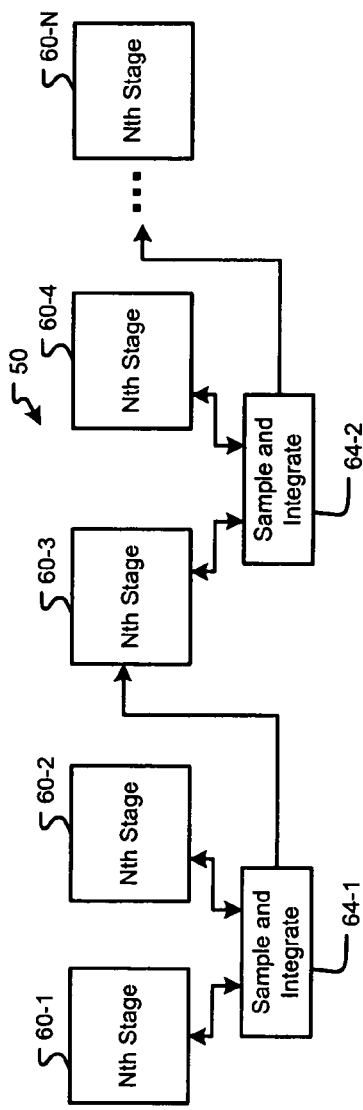
FIG. 2A is a functional block diagram of a sample and integrate circuit for use in a pipelined analog to digital converter having multiple stages.

Referring now to FIG. 2A, a sample and integrate circuit for use in a pipelined analog to digital converter 50 includes multiple stages 60-1, 60-2, and 60-N (collectively stages 60). A first sample and integrate circuit 64-1 is shared by the first and second stages 60-1 and 60-2. A second sample and integrate circuit 64-2 is shared by the third and fourth stages 60-3 and 60-4. An Mth sample and integrate circuit is shared by the (N−1)th and Nth stages 60-N−1 and 60-N. In some implementations, M=N/2, where M and N are integers.

Figure 2B:
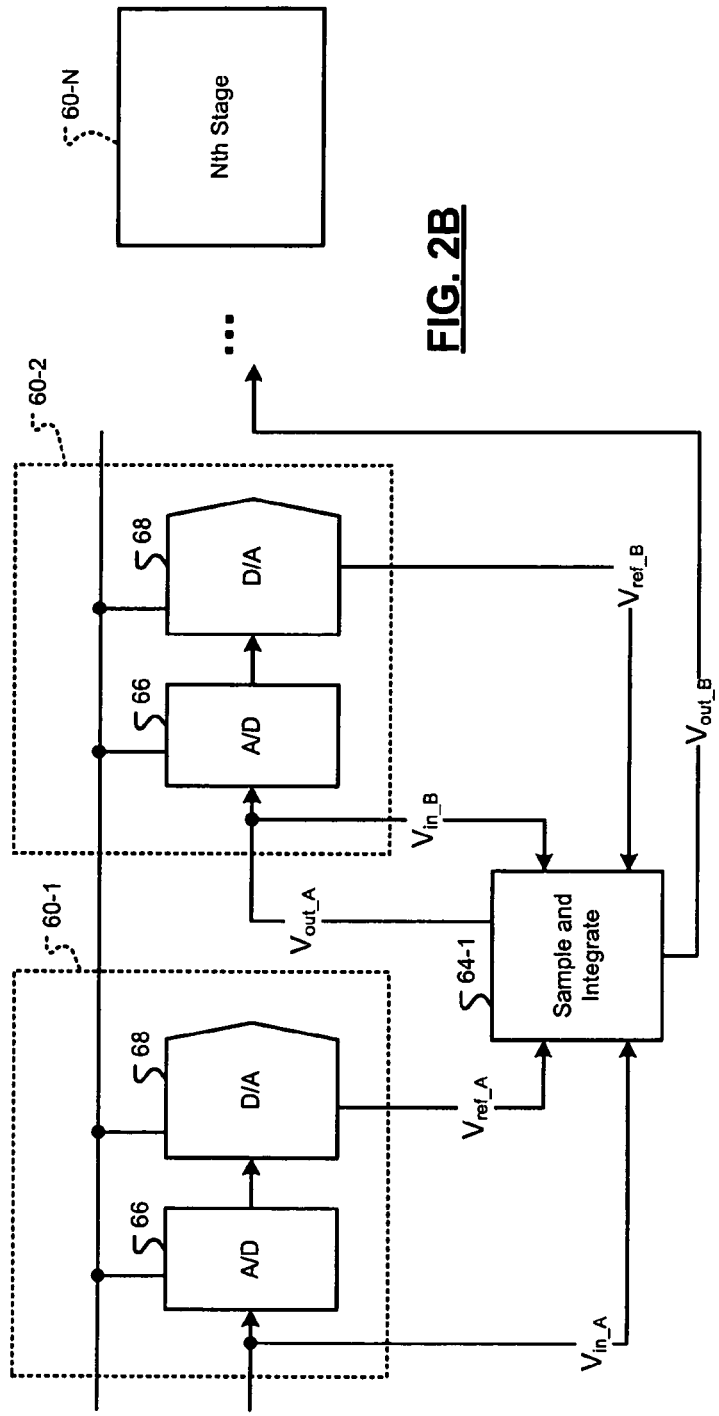
FIG. 2B is a more detailed functional block diagram of the sample and integrate circuit for adjacent stages of the pipelined analog to digital converter of FIG. 2A.

Referring now to FIG. 2B, the sample and integrate circuit 64-1 performs the functions of the sample circuit 14, the difference circuit 20 and the gain circuit 22, as will be described further below. The sample and integrate circuit 64 samples $V_{in\_A}$ during one cycle and then integrates a difference or residue between $V_{in\_A}$ and $V_{ref\_A}$, which is the output of the D/A module 68 of the first stage 60-1, and outputs the residue signal as $V_{out\_A}$. In an alternate clock phase the sample and integrate circuit 64-1 samples $V_{inB}$ (in this case, $V_{in\_B}=V_{out\_A}$ since the adjacent stages are used) and then integrates a difference or residue between $V_{in\_B}$ and $V_{ref\_B}$, which is the output of the D/A module 68 of the second stage 60-2, and outputs the residue signal as $V_{out\_B}$.

Figure 2C:
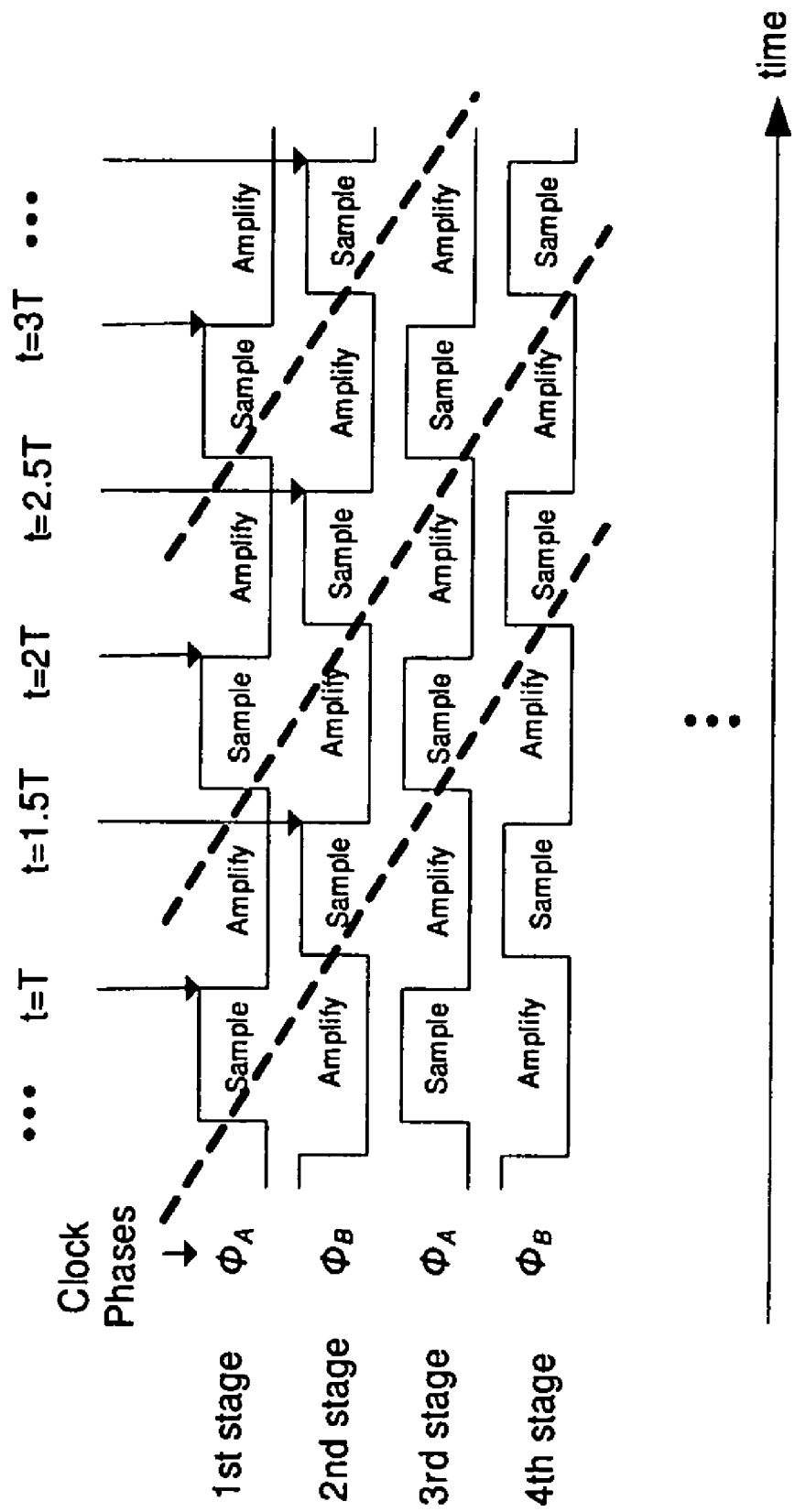
FIG. 2C is a timing diagram for the circuit of FIG. 2B.

Referring now to FIG. 2C, a timing diagram of the operation of the pipeline stages is shown. The first stage 60-1 samples the incoming signal at t=T, and then in the next phase the residue signal is amplified. Then, the subsequent stage 60-2 samples the amplified residue at t=1.5T, and the same process repeats. During operation, an operational amplifier used for the sample and integrate circuit is used only during the amplification phase of the clock period while it remains inactive during the sampling phase. As a result, the bias current expended during the sampling phase is wasted. The operational amplifier is a significant current consuming block in a pipeline stage.

Figure 3A:
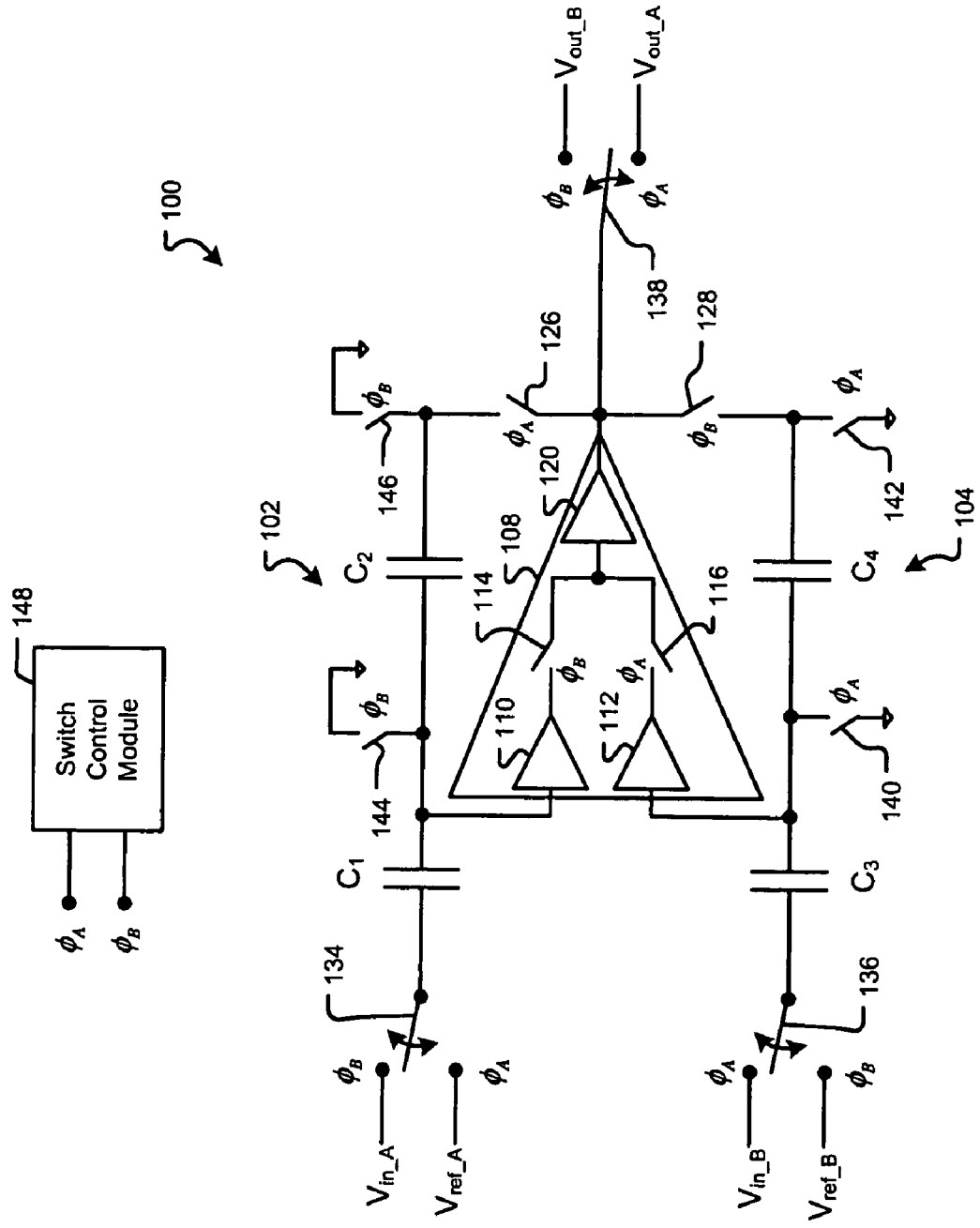
FIG. 3A is an electrical schematic of a first exemplary sample and integrate circuit.
Figure 3B:
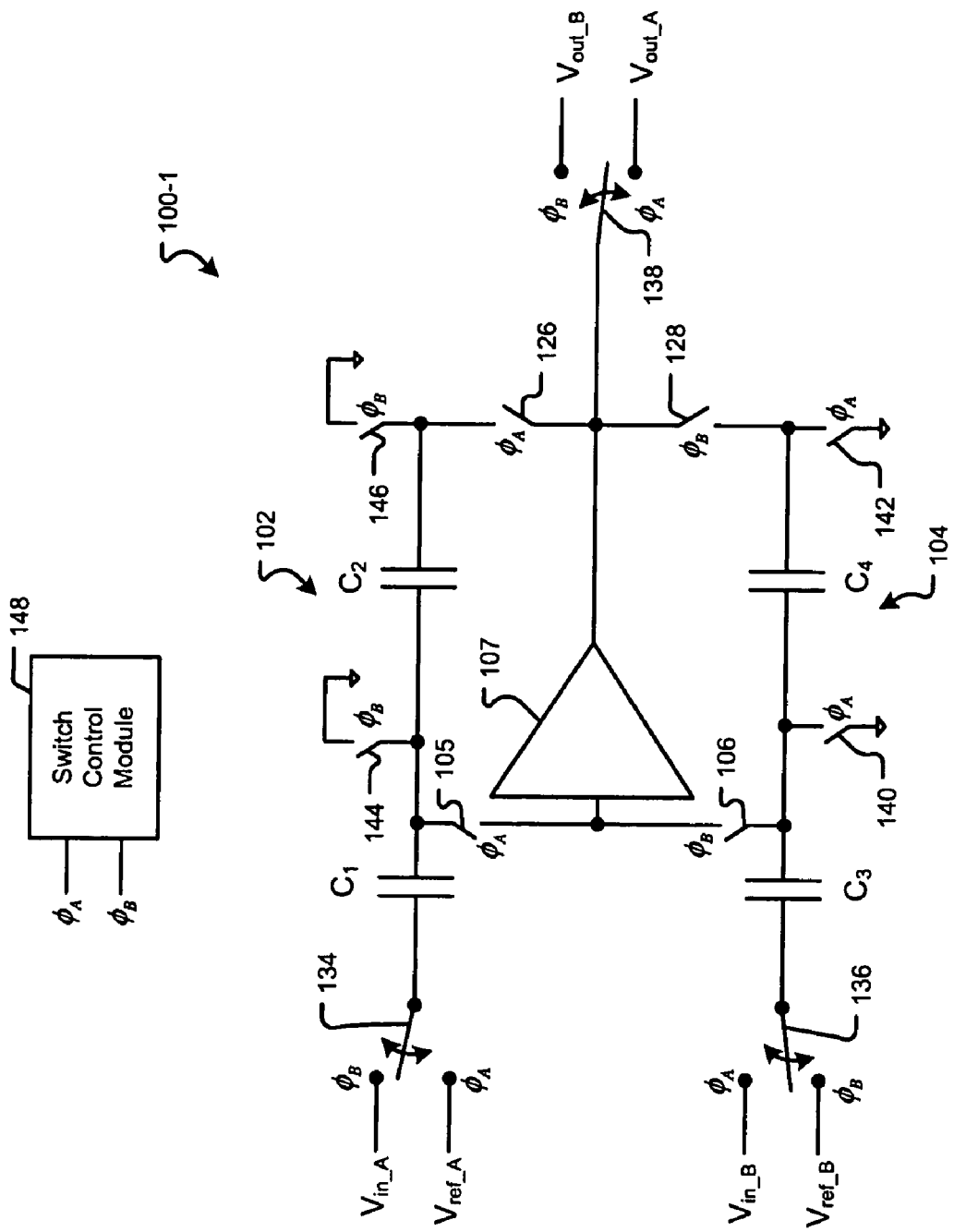
FIG. 3B is an electrical schematic of a second exemplary sample and integrate circuit.

Referring now to FIGS. 3A and 3B, the operational amplifier is shared between even and odd stages in a time multiplexed manner according to the present disclosure. One approach is shown in FIG. 3B. However, in this configuration, undesired coupling may occur through the parasitic capacitance of the off-state switches (105 and 106) to the sensitive summing nodes of the amplifier. In FIG. 3A, two different input stages are used for the operational amplifier to minimize coupling. Having two separate input stages improves isolation between even and odd stages since summing nodes are different.

Referring now to FIG. 3A, a first exemplary sample and integrate circuit 100 is shown. The sample and integrate circuit 100 includes first and second portions 102 and 104 that include capacitors C1 and C2 and C3 and C4, respectively. The capacitors C1 and C2 and C3 and C4 are connected in series. An amplifier 108 includes first and second inputs that are connected between capacitors C1 and C2 and C3 and C4, respectively. The amplifier 108 includes first and second switches 110 and 112 that are connected by switches 114 and 116, respectively, to an amplifier 120. One end of the capacitor C2 is connected by a switch 126 to an output of the amplifier 120. One end of the capacitor C3 is connected by a switch 128 to an output of the amplifier 120.

A switch 134 selectively connects the capacitor C1 to a voltage $V_{in\_A}$ or to $V_{ref\_A}$. $V_{ref\_A}$ is the output of the D/A converter 68 in the first stage. A switch 136 selectively connects the capacitors C3 to a voltage $V_{in\_B}$ or to $V_{ref\_B}$. $V_{ref\_B}$ is the output of the D/A converter in the second stage. A switch 138 selectively connects an output of the amplifier 120 to $V_{out\_B}$ or $V_{out\_A}$ since the two stages are adjacent. In this circuit, $V_{in\_B}=V_{out\_A}$. Switches 140, 142, 144 and 146 selectively ground capacitors C3, C4, C1 and C2, respectively. A switch control module 148 may be used to control the switches in the circuit 100. The state of the switch depends upon phases $\Phi_A$ and $\Phi_B$ as indicated in FIG. 3A. Having two separate input stages improves the isolation between even and odd stages since the summing nodes are different.

Referring now to FIG. 3B, a second exemplary sample and integrate circuit 100-1 is shown. An input of an amplifier 107 may be switched using switches 105 and 106. Undesired coupling can occur through the parasitic capacitance of the off-state switches (105 and 106) to the sensitive summing nodes of the amplifier.

Figure 4:
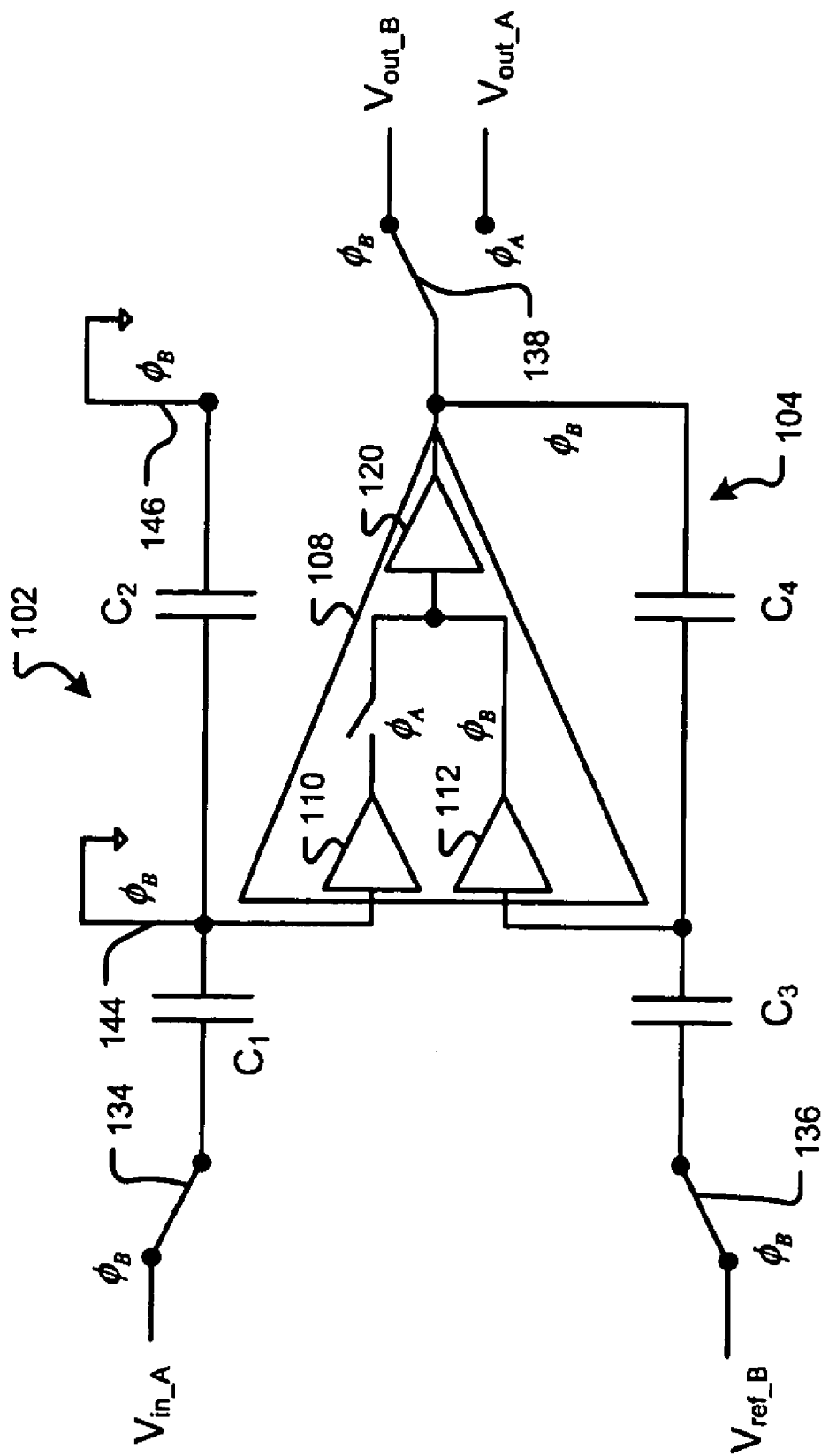
FIG. 4 is an electrical schematic of the circuit in FIG. 3A operating in a first phase.
Figure 5:
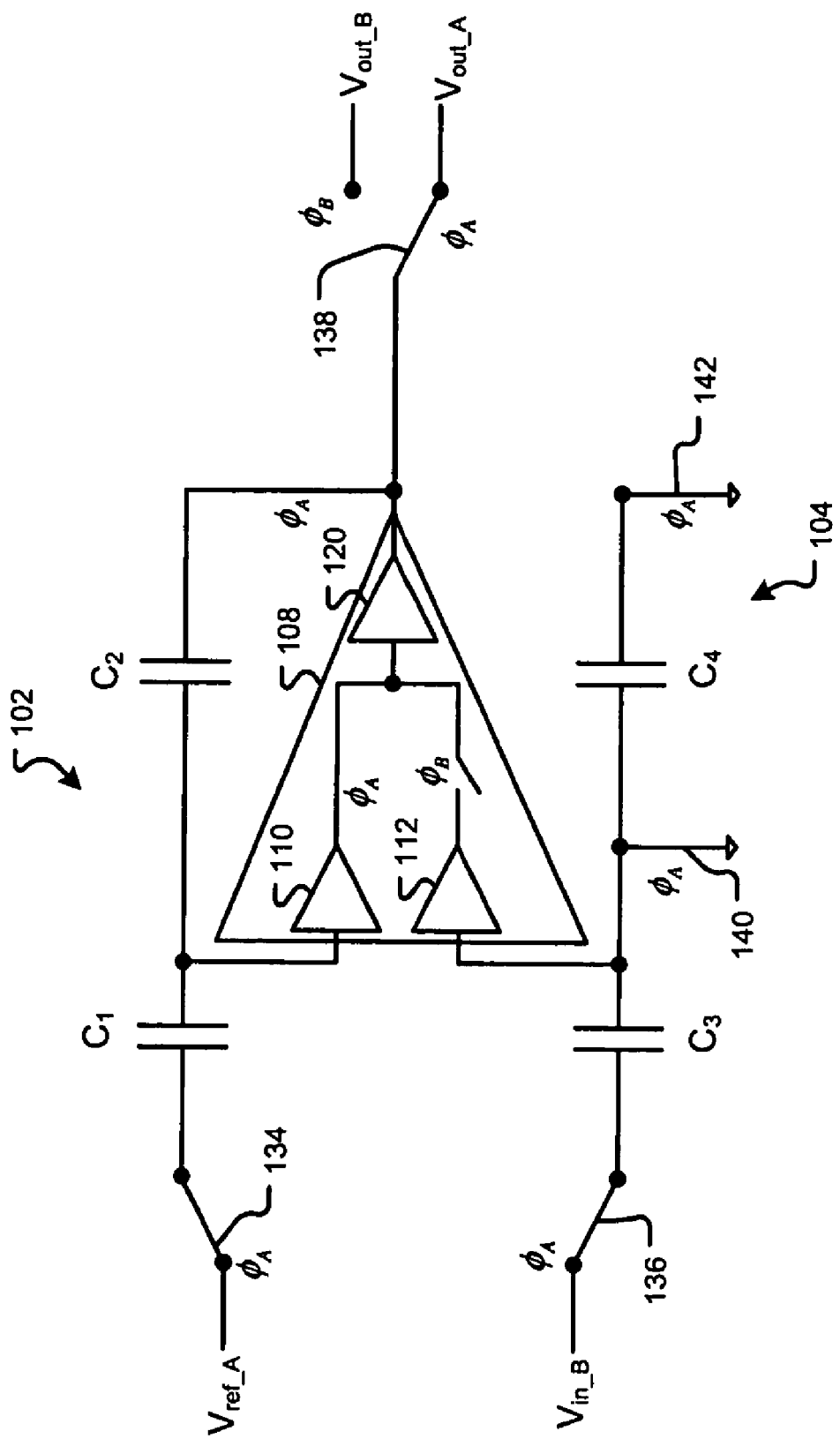
FIG. 5 is an electrical schematic of the circuit of FIG. 3A operating in a second phase.

Referring now to FIGS. 4 and 5, the circuit in FIG. 3A is shown operating in first and second phases. In FIG. 4, the switches are moved into the phase $\Phi_B$ position. In this position, the upper portion 102 samples an input voltage $V_{in\_A}$ for one stage (such as the first stage 60-1). The lower portion 104 integrates a difference between $V_{in\_B}$ and $V_{ref\_B}$ from another stage (such as the second stage 60-2).

In FIG. 5, the circuit of FIG. 3A is shown operating in a second phase. The switches are moved into the phase $\Phi_A$ position. In this position, the upper portion 102 integrates a difference between $V_{in\_A}$ and $V_{ref\_A}$ for the first stage 60-1. The lower portion 104 samples a voltage $V_{in\_B}$ from the second stage 60-2.

Figure 6B:
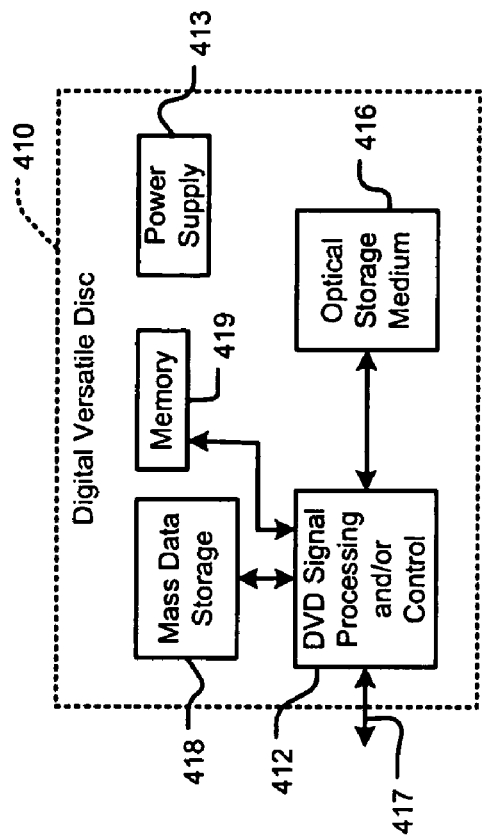
FIG. 6B is a functional block diagram of a digital versatile disk (DVD)
Figure 6A:
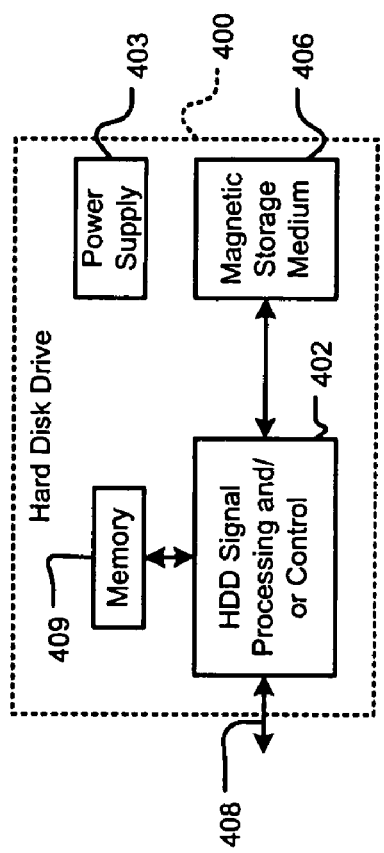
FIG. 6A is a functional block diagram of a hard disk drive.

Referring now to FIGS. 6A-6G, various exemplary implementations of the device are shown. Referring now to FIG. 6A, the device can be implemented in a hard disk drive 400. The device may implement and/or be implemented in analog to digital converters in either or both signal processing and/or control circuits and/or a power supply 403, which are generally identified in FIG. 6A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 6B, the device can be implemented in a digital versatile disc (DVD) drive 410. The device may implement and/or be implemented in analog to digital converters in either or both signal processing and/or control circuits, which are generally identified in FIG. 6B at 412, mass data storage of the DVD drive 410 and/or a power supply 413. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 6A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 6D:
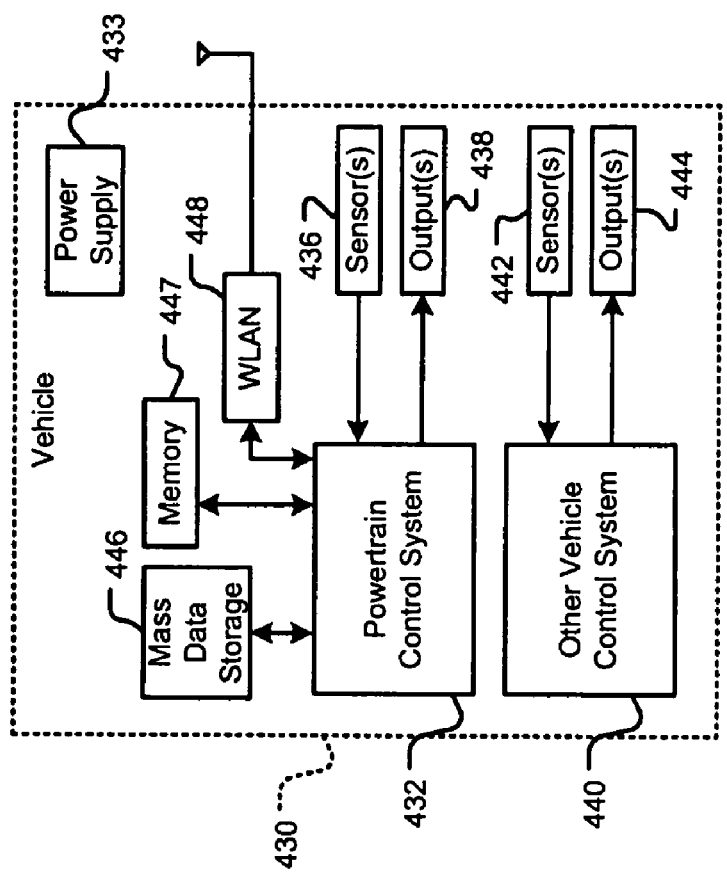
FIG. 6D is a functional block diagram of a vehicle control system.
Figure 6C:
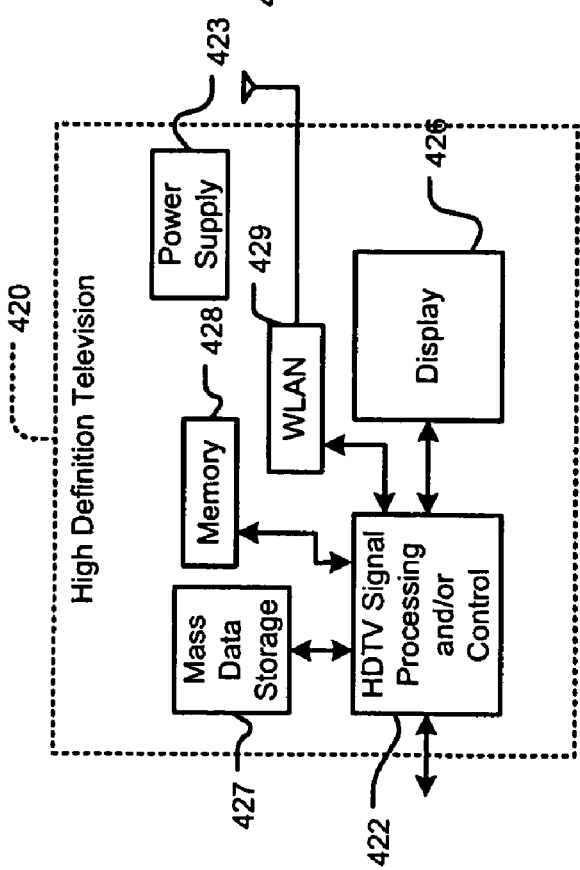
FIG. 6C is a functional block diagram of a high definition television.

Referring now to FIG. 6C, the device can be implemented in a high definition television (HDTV) 420. The device may implement and/or be implemented in analog to digital converters in either or both signal processing and/or control circuits, which are generally identified in FIG. 6E at 422, a WLAN interface, mass data storage of the HDTV 420 and/or a power supply 423. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 6D, The device may implement and/or be implemented in analog to digital converters in a control system of a vehicle 430, a WLAN interface, mass data storage of the vehicle control system and/or a power supply 433. In some implementations, the device implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The device may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 6E:
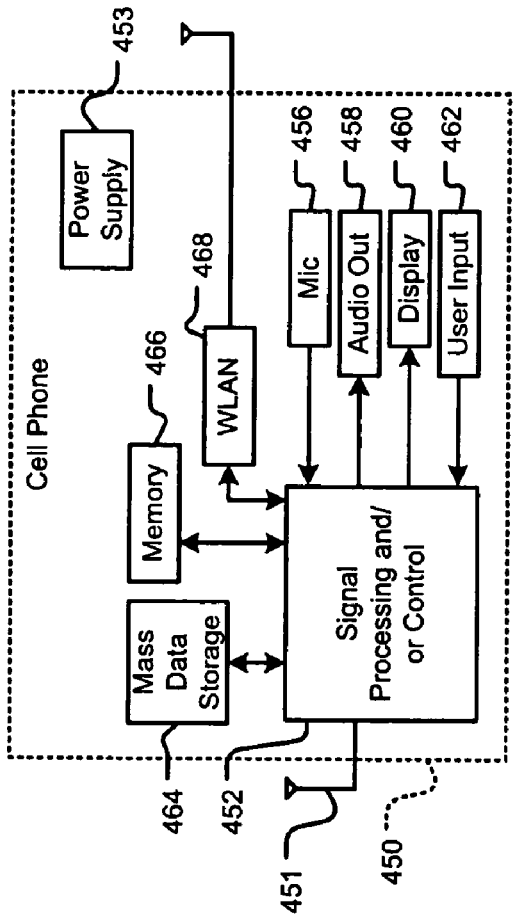
FIG. 6E is a functional block diagram of a cellular phone.

Referring now to FIG. 6E, the device can be implemented in a cellular phone 450 that may include a cellular antenna 451. The device may implement and/or be implemented in analog to digital converters in either or both signal processing and/or control circuits, which are generally identified in FIG. 6E at 452, a WLAN interface, mass data storage of the cellular phone 450 and/or a power supply 453.] In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 6F:
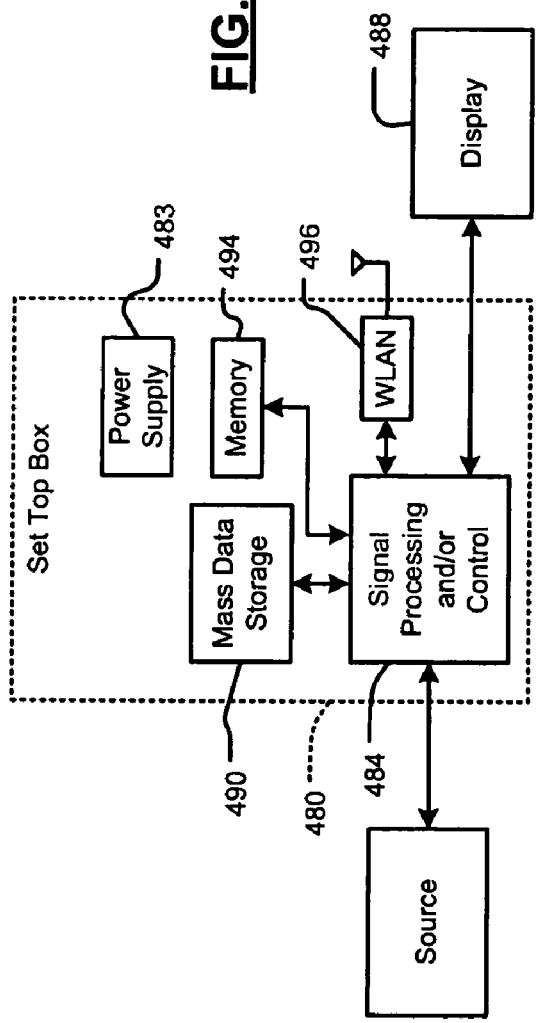
FIG. 6F is a functional block diagram of a set top box.

Referring now to FIG. 6F, the device can be implemented in a set top box 480. The device may implement and/or be implemented in analog to digital converters in either or both signal processing and/or control circuits, which are generally identified in FIG. 6F at 484, a WLAN interface, mass data storage of the set top box 480 and/or a power supply 483. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 6G:
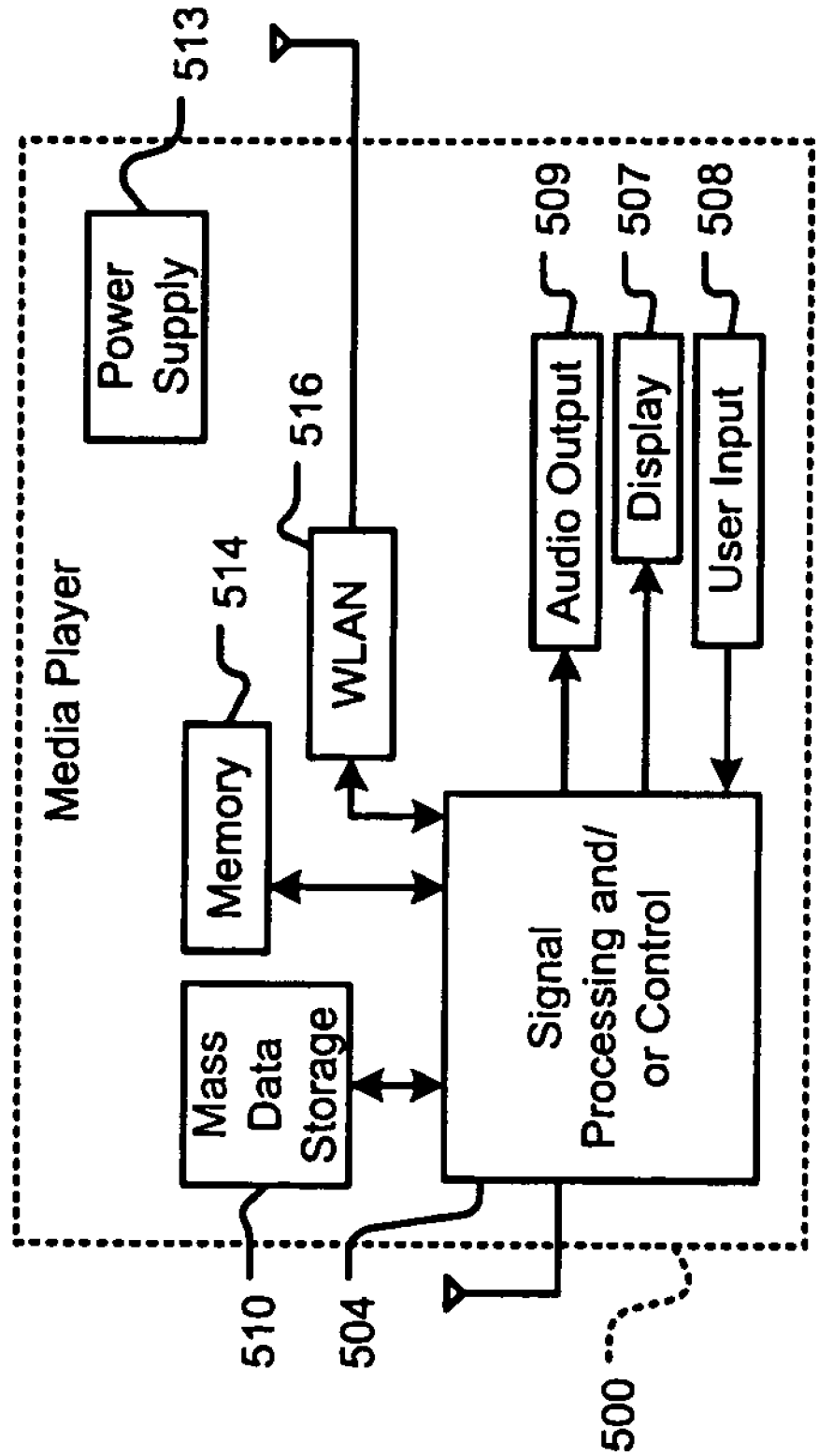
FIG. 6G is a functional block diagram of a media player.

Referring now to FIG. 6G, the device can be implemented in a media player 500. The device may implement and/or be implemented in analog to digital converters in either or both signal processing and/or control circuits, which are generally identified in FIG. 6G at 504, a WLAN interface, mass data storage of the media player 500 and/or a power supply 503.] In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A pipelined analog to digital converter, comprising:
   N stages, wherein N is an integer greater than one;
   a sample and integrate circuit that communicates with at least two stages of said N stages and that:
      selectively samples a first voltage input to one of said at least two stages while integrating a difference between a sampled second voltage input of another one of said at least two stages and a second reference voltage to generate a second residue, and
      selectively integrates a difference between said sampled first voltage and a first reference voltage to generate a first residue while sampling a second voltage input.

2. The pipelined analog to digital converter of claim 1 wherein said sample and integrate circuit further comprises:
   first and second capacitances connected in series;
   third and fourth capacitances connected in series; and
   an amplifier module that selectively communicates with said first and second capacitances and said third and fourth capacitances, respectively.

3. The pipelined analog to digital converter of claim 1 further comprising:
   a first switch that selectively connects said first capacitance to one of said first reference voltage and said first voltage input; and
   a second switch that selectively connects said third capacitance to one of said second reference voltage and said second voltage input.

4. The pipelined analog to digital converter of claim 2 wherein said amplifier module comprises:
   a first amplifier that communicates with said first and second capacitances; and
   a second amplifier that communicates with said third and fourth capacitances.

5. The pipelined analog to digital converter of claim 4 further comprising:
   a first switch that communicates with said first amplifier;
   a second switch that communicates with said second amplifier; and
   a third amplifier that communicates with said first and second switches.

6. The pipelined analog to digital converter of claim 2 wherein said amplifier module comprises:
   a first switch that communicates with said first and second capacitances; and
   a second switch that communicates with said third and fourth capacitances.

7. The pipelined analog to digital converter of claim 6 further comprising an amplifier that communicates with said first and second switches.

8. The pipelined analog to digital converter of claim 2 further comprising a first switch that selectively connects an output of said amplifier module to one of said first stage and said second stage.

9. The pipelined analog to digital converter of claim 2 further comprising a plurality of switches that selectively ground first ends of at least two of said first, second, third and fourth capacitances.

10. The pipelined analog to digital converter of claim 1 wherein one of said N stages further comprises:
    a first analog to digital converter module that converts said sampled first voltage input to a first digital signal; and
    a first digital to analog converter module that converts said first digital signal to said first voltage reference;

wherein another of said N stages further comprises:
a second analog to digital converter module that converts said sampled second voltage input to a second digital signal; and
a second digital to analog converter module that converts said second digital signal to said second voltage reference.

11. A pipelined analog to digital converter, comprising:
N stages, wherein N is an integer greater than one;
a sample and integrate circuit that communicates with at least two stages of said N stages and that includes an amplifier module that receives a sampled input and a reference voltage input and that integrates for one of said N stages based on said sampled input and said reference voltage input while said sample and integrate circuit samples for another one of said N stages.

12. A pipelined analog to digital converter, comprising:
N stages, wherein N is an integer greater than one;
a sample and integrate circuit that communicates with at least two stages of said N stages and that includes an amplifier module that integrates for one of said N stages while said sample and integrate circuit samples for another one of said N stages and that integrates for said another one of said N stages while said sample and integrate circuit samples for said one of said N stages,
wherein said sample and integrate circuit selectively samples a first voltage input to said one of said at least two stages while integrating a difference between a sampled second voltage input to said another one of said stages and a second reference voltage to generate a second residue, and selectively integrates a difference between said sampled first voltage and a first reference voltage to generate a first residue while sampling a second voltage input.

13. The pipelined analog to digital converter of claim 12 wherein said sample and integrate circuit further comprises:
first and second capacitances connected in series;
third and fourth capacitances connected in series,
wherein said amplifier module selectively communicates with said first and second capacitances and said third and fourth capacitances, respectively.

14. The pipelined analog to digital converter of claim 13 further comprising:
a first switch that selectively connects said first capacitance to one of said first reference voltage and said first voltage input; and
a second switch that selectively connects said third capacitance to one of said second reference voltage and said second voltage input.

15. The pipelined analog to digital converter of claim 13 wherein said amplifier module comprises:
a first amplifier that communicates with said first and second capacitances; and
a second amplifier that communicates with said third and fourth capacitances.

16. The pipelined analog to digital converter of claim 15 comprising:
a first switch that communicates with said first amplifier;
a second switch that communicates with said second amplifier; and
a third amplifier that communicates with said first and second switches.

17. The pipelined analog to digital converter of claim 13 wherein said amplifier module comprises:
a first switch that communicates with said first and second capacitances;
a second switch that communicates with said third and fourth capacitances; and
an amplifier that communicates with said first and second switches.

18. The pipelined analog to digital converter of claim 13 further comprising a first switch that selectively connects an output of said amplifier module to one of said first stage and said second stage.

19. The pipelined analog to digital converter of claim 13 further comprising a plurality of switches that selectively ground first ends of at least two of said first, second, third and fourth capacitances.

20. The pipelined analog to digital converter of claim 12 wherein one of said N stages further comprises:
a first analog to digital converter module that converts said sampled first voltage input to a first digital signal; and
a first digital to analog converter module that converts said first digital signal to said first voltage reference;
wherein another of said N stages further comprises:
a second analog to digital converter module that converts said sampled second voltage input to a second digital signal; and
a second digital to analog converter module that converts said second digital signal to said second voltage reference.

21. A pipelined analog to digital converter, comprising:
N stages, wherein N is an integer greater than one;
sample and integrate means that communicates with at least two stages of said N stages for selectively sampling a first voltage input to one of said at least two stages while integrating a difference between a sampled second voltage input of another one of said at least two stages and a second reference voltage to generate a second residue, and for selectively integrating a difference between said sampled first voltage and a first reference voltage to generate a first residue while sampling a second voltage input.

22. The pipelined analog to digital converter of claim 21 wherein said sample and integrate circuit further comprises:
first and second capacitance means connected in series for providing capacitance;
third and fourth capacitance means connected in series for providing capacitance; and
amplifier means for amplifying and for selectively communicating with said first and second capacitance means and said third and fourth capacitance means, respectively.

23. The pipelined analog to digital converter of claim 21 further comprising:
first switch means for selectively connecting said first capacitance means to one of said first reference voltage and said first voltage input; and
a second switch means for selectively connecting said third capacitance means to one of said second reference voltage and said second voltage input.

24. The pipelined analog to digital converter of claim 22 wherein said amplifier means comprises:
a first amplifier that communicates with said first and second capacitance means; and
a second amplifier that communicates with said third and fourth capacitance means.

25. The pipelined analog to digital converter of claim 24 further comprising:
first switch means for switching that communicates with said first amplifier;
second switch means for switching that communicates with said second amplifier; and third amplifier that communicates with said first and second switch means.

26. The pipelined analog to digital converter of claim 22 wherein said amplifier means comprises:
   first switch means for switching that communicates with said first and second capacitance means; and
   second switch means for switching that communicates with said third and fourth capacitance means.

27. The pipelined analog to digital converter of claim 26 further comprising an amplifier that communicates with said first and second switch means.

28. The pipelined analog to digital converter of claim 22 further comprising first switch means for selectively connecting an output of said amplifier means to one of said first stage and said second stage.

29. The pipelined analog to digital converter of claim 22 further comprising switch means for selectively grounding first ends of at least two of said first, second, third and fourth capacitance means.

30. The pipelined analog to digital converter of claim 21 wherein one of said N stages further comprises:
   first analog to digital converter means for converting said sampled first voltage input to a first digital signal; and
   first digital to analog converter means for converting said first digital signal to said first voltage reference;
   wherein another of said N stages further comprises:
   second analog to digital converter means for converting said sampled second voltage input to a second digital signal; and
   second digital to analog converter means for converting said second digital signal to said second voltage reference.

31. A pipelined analog to digital converter, comprising:
   N stages, wherein N is an integer greater than one;
   sample and integrate means for sampling and integrating, that communicates with at least two stages of said N stages and that includes amplifying amplifier means for receiving a sampled input and a reference voltage input and for integrating for one of said N stages based on said sampled input and said reference voltage input while said sample and integrate means samples for another one of said N stages.

32. A pipelined analog to digital converter, comprising:
   N stages, wherein N is an integer greater than one;
   sample and integrate means for sampling and integrating, that communicates with at least two stages of said N stages and that includes amplifier means for integrating for one of said N stages while said sample and integrate means samples for another one of said N stages and for integrating for said another of said N stages while said sample and integrate means samples for said one of said N stages,
   wherein said sample and integrate means selectively samples a first voltage input to said one of said at least two stages while integrating a difference between a sampled second voltage input to said another one of said stages and a second reference voltage to generate a second residue, and selectively integrates a difference between said sampled first voltage and a first reference voltage to generate a first residue while sampling a second voltage input.

33. The pipelined analog to digital converter of claim 32 wherein said sample and integrate circuit further comprises:
   first and second capacitance means connected in series for providing capacitance;
   third and fourth capacitance means connected in series for providing capacitance,
   wherein said amplifier means amplifies and selectively communicates with said first and second capacitance means and said third and fourth capacitance means, respectively.

34. The pipelined analog to digital converter of claim 33 further comprising:
   first switch means for selectively connecting said first capacitance means to one of said first reference voltage and said first voltage input; and
   second switch means for selectively connecting said third capacitance means to one of said second reference voltage and said second voltage input.

35. The pipelined analog to digital converter of claim 33 wherein said amplifier means comprises:
   a first amplifier that communicates with said first and second capacitance means; and
   a second amplifier that communicates with said third and fourth capacitance means.

36. The pipelined analog to digital converter of claim 35 comprising:
   first switch means for switching that communicates with said first amplifier;
   second switch means for switching that communicates with said second amplifier;
   a third amplifier that communicates with said first and second switch means.

37. The pipelined analog to digital converter of claim 33 wherein said amplifier means comprises:
   first switch means for switching that communicates with said first and second capacitance means; and
   second switch means for switching that communicates with said third and fourth capacitance means; and
   an amplifier that communicates with said first and second switch means.

38. The pipelined analog to digital converter of claim 33 further comprising first switch means for selectively connecting an output of said amplifier means to one of said first stage and said second stage.

39. The pipelined analog to digital converter of claim 33 further comprising switch means for selectively grounding first ends of at least two of said first, second, third and fourth capacitance means.

40. The pipelined analog to digital converter of claim 32 wherein one of said N stages further comprises:
   first analog to digital converter means for converting said sampled first voltage input to a first digital signal; and
   a first digital to analog converter means for converting said first digital signal to said first voltage reference;
   wherein another of said N stages further comprises:
   a second analog to digital converter means for converting said sampled second voltage input to a second digital signal; and
   a second digital to analog converter means for converting said second digital signal to said second voltage reference.

41. A method for operating a pipelined analog to digital converter, comprising:
   providing N stages, wherein N is an integer greater than one;
   selectively sampling a first voltage input to one of at least two stages of said N stages while integrating a difference between a sampled second voltage input of another one of said at least two stages and a second reference voltage to generate a second residue using a sample and integrate circuit; and
   selectively integrating a difference between said sampled first voltage and a first reference voltage to generate a first residue while sampling a second voltage input said another of said at least two stages using a sample and integrate circuit.

42. The method of claim 41 further comprising:
converting said sampled first voltage input to a first digital signal;
converting said first digital signal to said first voltage reference;
converting said sampled second voltage input to a second digital signal; and
converting said second digital signal to said second voltage reference.

43. A method of operating a pipelined analog to digital converter, comprising:
providing N stages, wherein N is an integer greater than one; and
for at least two stages of said N stages, using a first operational amplifier of a sample and integrate circuit to receive a sampled input and a reference voltage input and to integrate for one of said two stages based on said sampled input and said reference voltage input while said sample and integrate circuit samples for another one of said two stages.

44. A method of operating a pipelined analog to digital converter, comprising:
providing N stages, wherein N is an integer greater than one;
for at least two stages of said N stages, using a first operational amplifier of a sample and integrate circuit to integrate for one of said two stages while said sample and integrate circuit samples for another one of said two stages and to integrate for said another one of said two stages while said sample and integrate circuit samples for said one of said two stages;
selectively sampling a first voltage input to one of at least two stages of said N stages while integrating a difference between a sampled second voltage input of another one of said at least two stages and a second reference voltage to generate a second residue; and
selectively integrating a difference between said sampled first voltage and a first reference voltage to generate a first residue while sampling a second voltage input said another of said at least two stages.

45. The method of claim 44 further comprising:
converting said sampled first voltage input to a first digital signal;
converting said first digital signal to said first voltage reference;
converting said sampled second voltage input to a second digital signal; and
converting said second digital signal to said second voltage reference.

46. The pipelined analog to digital converter of claim 11 wherein said first amplifier integrates for said another one of said N stages while said sample and integrate circuit samples for said one of said N stages.

47. The pipelined analog to digital converter of claim 11 wherein said first amplifier receives a sampled input and a residue voltage input signal from an output of one of said N stages.

48. The pipelined analog to digital converter of claim 11 wherein said sample and integrate circuit selectively samples a first voltage input to said one of said at least two stages while integrating a difference between a sampled second voltage input to said another one of said stages and a second reference voltage to generate a second residue.

49. The pipelined analog to digital converter of claim 11 wherein said sample and integrate circuit selectively samples a first voltage input to said one of said at least two stages and selectively integrates a difference between said sampled first voltage and a first reference voltage to generate a first residue while sampling a second voltage input.

50. The pipelined analog to digital converter of claim 11 wherein said reference voltage input is in selective communication with said first amplifier.

51. The pipelined analog to digital converter of claim 11 comprising a switch for selection of said sampled input and said reference voltage input.

52. The pipelined analog to digital converter of claim 11 wherein said reference voltage input is received from one of said N stages.

53. The pipelined analog to digital converter of claim 31 wherein said amplifying means integrates for said another of said N stages while said sample and integrate means samples for said one of said N stages.

54. The method of claim 43 wherein said first operational amplifier integrates for said another one of said two stages while said sample and integrate circuit samples for said one of said two stages.

* * * * *

UNITED STATES PATENT AND TRADEMARK OFFICE
CERTIFICATE OF CORRECTION

PATENT NO.        : 7,397,412 B1                                Page 1 of 1
APPLICATION NO. : 11/486906
DATED             : July 8, 2008
INVENTOR(S)      : Thomas B. Cho It is certified that error appears in the above-identified patent and that said Letters Patent is hereby corrected as shown below:

Column 6, Line 36      Delete "]" after "453"
Column 7, Line 28      Delete "]" after "503"

Signed and Sealed this

Second Day of December, 2008

JON W. DUDAS
*Director of the United States Patent and Trademark Office*